(12) United States Patent
Oh

(10) Patent No.: US 6,462,347 B1
(45) Date of Patent: Oct. 8, 2002

(54) CHARGE EXCHANGER, ION IMPLANTATION SYSTEM COMPRISING THE CHARGE EXCHANGER, AND METHOD OF CONTROLLING THE RATE AT WHICH THE POLARITY OF IONS IS CHANGED

(75) Inventor: Sang-kuen Oh, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/406,849

(22) Filed: Sep. 29, 1999

(30) Foreign Application Priority Data

Nov. 17, 1998 (KR) .............................................. 98-49185

(51) Int. Cl.$^7$ .............................................. H01J 37/317
(52) U.S. Cl. ............................ 250/492.21; 250/423 R; 313/146; 315/505
(58) Field of Search ................... 250/492.21, 423 R; 313/146; 315/505

(56) References Cited

U.S. PATENT DOCUMENTS 3,806,749 A * 4/1974 Yntema ........................ 313/15
3,866,132 A * 2/1975 Gorka, Jr. .................... 313/149
3,867,704 A * 2/1975 Gorka, Jr. .................... 315/505
4,980,556 A * 12/1990 O'Connor et al. ......... 250/423 R
5,670,785 A * 9/1997 Kitamura ................... 250/423 R

* cited by examiner

Primary Examiner—Jack Berman
(74) Attorney, Agent, or Firm—Volentine Francos, PLLC

(57) ABSTRACT

An charge exchanger for changing the polarity of an ion beam includes an charge exchange member provided in the path of an ion beam, and through which the ion beam can pass, and charge conversion material coating the surface of the charge exchange member. The charge conversion material is, for example, a fine powder of particles of magnesium against which the ion beam collides. The charge exchange rate caused by such collisions is controlled based on the measured dosage of ions injected into a target or on predetermined ion injection conditions. First, a desired ion dosage is determined based on the specifics of the ion implantation to be carried out. Then, an ion beam is injected onto a wafer after having been passed through the charge exchanger. Finally, the charge exchange member is advanced at a speed which establishes an charge exchange rate that gives rise to conditions necessary for the specific ion implantation process to occur.

29 Claims, 8 Drawing Sheets

CHARGE EXCHANGER, ION IMPLANTATION SYSTEM COMPRISING THE CHARGE EXCHANGER, AND METHOD OF CONTROLLING THE RATE AT WHICH THE POLARITY OF IONS IS CHANGED

BACKGROUND OF THE INVENTION

1. Field of the Invention

The present invention relates to an charge exchanger, to a method by which the polarity of an ion beam is changed by the charge exchanger, and to an ion implantation system comprising the charge exchanger. More particularly, the present invention relates to an charge exchanger which produces Mg (magnesium) molecules for collision with an ion beam, which collision acts to change the polarity of the beam, and to a method of controlling the amount of the Mg colliding with the ion beam so as to regulate the rate at which the polarity of the ions of the beam is changed.

2. Description of the Related Art

An charge exchanger changes the polarity of ions from positive to negative ions, or from negative to positive. One of the main factors in assessing the efficiency of the charge exchanger is the rate at which the polarity of the ions is changed. One type of system that employs an charge exchanger is an ion implantation system used in the fabricating of semiconductor devices.

In general, ion implantation refers to technology in which ions are injected into a given target. In a conventional ion implantation technique, the energy supplied to the ions is sufficient to accelerate the ions to such a degree that they can penetrate the target surface.

With such a technique, the concentration of impurities can be maintained within a range of $10^{14}$ to $10^{18}$ atoms/cm$^3$. Such a technique is widely used for implanting ions into a given target material because it controls the concentration of impurities better than other impurity implantation techniques.

An ion implantation system generally includes at least the following components: a vacuum apparatus, an ion source, an ion extractor, an charge exchanger, a mass analyzer, an accelerator tube, and a final process station. The system is designed to supply varying levels of high voltage to effect ion decomposition, extraction, and acceleration. During the ion implantation process, the gas molecules supplied from the ion source collide with hot electrons and are extracted by an electric field formed by the applied voltage. The extracted ions form an ion beam. The ions are selectively analyzed for their charge while the ion beam is diffracted, and the ion beam is then accelerated sufficiently to penetrate a wafer to an intended depth.

Figure 1:
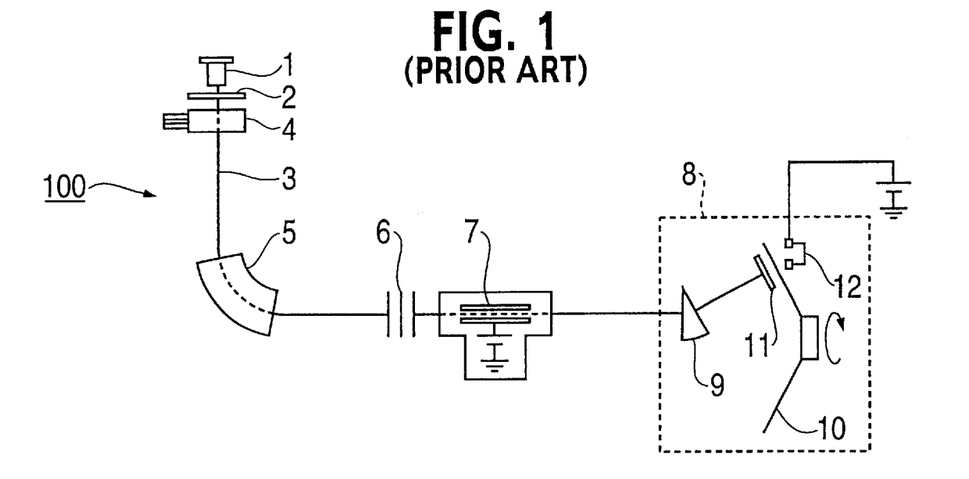
FIG. 1 is a schematic diagram of a typical ion implantation system.

The above-described conventional ion implantation system generally has a structure as shown in FIG. 1. In the ion implantation system 100, a positive ion beam 3 is extracted from an ion source 1 through an extractor 2, and the positive ion beam 3 is converted into a negative ion beam at an charge exchanger 4. The negative ion beam is supplied to a mass analyzer 5. In the mass analyzer 5, the ion beam is diffracted by a magnetic field and is analyzed.

Next, the ion beam 3 is accelerated by an accelerator 6. The energy by which the ion beam is made to travel is doubled by the accelerator 6. The accelerated ion beam passes through a stripper 7 which changes the polarity of the ion beam from negative to positive. The accelerating ion beam then passes through a magnet 9 of a final processing (ion implantation) station 8. The magnet 9 deflects the beam onto a wafer 11 held on a disk 10.

While some of the ions are injected into the wafer, the remainder of the ion beam 3 passes through the disk 10 and collides with a Faraday Cup 12. Here, the dosage is measured by the flow of the electrons supplied from the ground.

As described above, the implantation system 100 effects two ion exchanges, one at the charge exchanger 4 where the polarity of the ion beam is changed from positive to negative, and the other at the stripper 7 where the polarity of the beam is changed from negative to positive.

Figure 2:
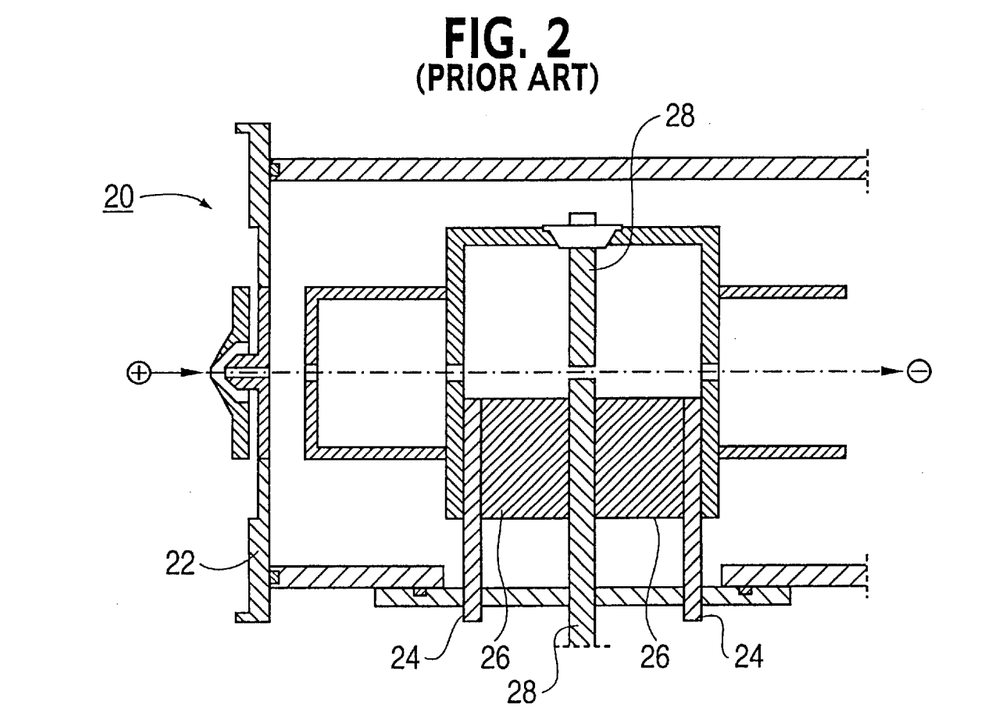
FIG. 2 is a cross-sectional view of a prior art charge exchanger used in such an ion implantation system.

One example of a conventional charge exchanger 20 is shown in FIG. 2. In this device, a solid piece of Mg 26 is installed in a casing 22 through a hole in the casing 22. A heater 28 is inserted through the center of the piece of Mg 26.

The heater 28 is heated to produce a temperature of 450° C. or more. At this time, a vacuum is formed inside the charge exchanger 20. The heat vaporizes the Mg. The resulting gaseous magnesium molecules collide with the ion beam 3 extracted from the ion source 1. Then, the ion beam 3 receives the electrons from the magnesium molecules and consequently acquires a negative net charge. For example, $BF^{2+}$ ions are converted to BF and $F^-$ ions, and $BF^+$ ions to B and $F^-$ ions, $B^+$ to $B^-$ ions, and $F^+$ to $F^-$ ions.

The ion exchange rate can be measured as the percentage of the ions making up the positive ion beam which become negative. The conventional charge exchanger 20 effects a very low ion exchange rate of less than 5%.

A low ion exchange rate means that a small amount of the magnesium molecules bonded with the extracted ions. The magnesium molecules, which have not bonded with the extracted ions, flow inside the charge exchanger 20, and when the ion implantation is completed, and the inner temperature of the charge exchanger 20 cools to less than 250° C., the molecules attach to the inside of the charge exchanger 20 and contaminate the same. The molecules especially contaminate an area around the vacuum seal (not shown). The charge exchanger must therefore be cleaned periodically to remove the contaminants.

In addition, heating the magnesium 26 to a high enough temperature to form gaseous magnesium molecules requires a large amount of power. This contributes to the high cost of running the facility.

SUMMARY OF THE INVENTION

An object of the present invention is to provide an charge exchanger capable of establishing a high exchange rate which contributes to the efficiency of the facility in which the charge exchanger is employed.

To achieve this object, the charge exchanger of the present invention comprises an ion exchange member provided in the path of an ion beam, and through which member the ion beam can pass, and a charge conversion material coating the member. The charge conversion material is made up of charged particles that will change the polarity of the ion beam when ions of the ion beam collide with them.

The charge exchanger further comprises a drive means in the form of a motor or the like for advancing the member while it is being impinged by the ion beam in order to provide new particles of charge conversion material for collision with the ions of the ion beam.

The ion exchange member is in the form of tape wound around a pair of rotary shafts. The motor is connected to one of the shafts to rotate the same and thereby advance the ion exchange member. Means may be provided for controlling the speed of the motor. In this case, the ion exchange member is provided with indicia, and a sensor senses the indicia as the ion exchange member is being advanced. The indicia can be magnetic imprints formed on the tape or a series of holes formed in the tape. Information from the sensor is used as feedback to control the speed of the motor.

Another object of the present invention is to provide a method in which the ion exchange rate can be controlled to effect a precise ion implantation, based on the dosage of ions injected into a target or on preselected ion injection parameters.

To achieve this object, the present invention provides a method in which the ion exchange rate is controlled during ion implantation by predetermining an ion dosage on the basis of the desired ion implantation process to be carried out, directing an ion beam to the wafer through the ion exchange member, and controlling the speed at which the ion exchange member is advanced to establish an ion exchange rate that produces an ion beam of a dosage that will effect the desired ion implantation process.

The speed is selected by measuring the dosage of the ion beam injected into the wafer or determining the ionization state of the ion beam required to effect an appropriate ion exchange rate, and based on this information, advancing the ion exchange member at a speed which establishes the necessary ion exchange rate.

A further object of the present invention is to provide an ion implantation system in which the ion exchange rate is high, the contamination of the charge exchanger is kept low, and which requires a relatively low amount of power to operate.

To achieve this object, the present invention provides an ion implantation system comprising an extractor for forming an ion beam from a source of ions, a mass analyzer for mass-analyzing the ion beam, an charge exchanger for changing the polarity of the ion beam, an accelerator for supplying the ion beam with energy in order to accelerate the ion beam, and an ion implantation station at which an ion beam is injected into a wafer, the charge exchanger comprising a casing having an inlet and an outlet through which the ion beam passes, an ion exchange member disposed in the path of the ion beam and having charge conversion material which will change the polarity of the ion beam when the ion beam collides therewith, and drive means for advancing the ion exchange member to provide a new surface of charge conversion material against which the ion beam will collide.

DETAILED DESCRIPTION OF PREFERRED EMBODIMENTS

Figure 3:
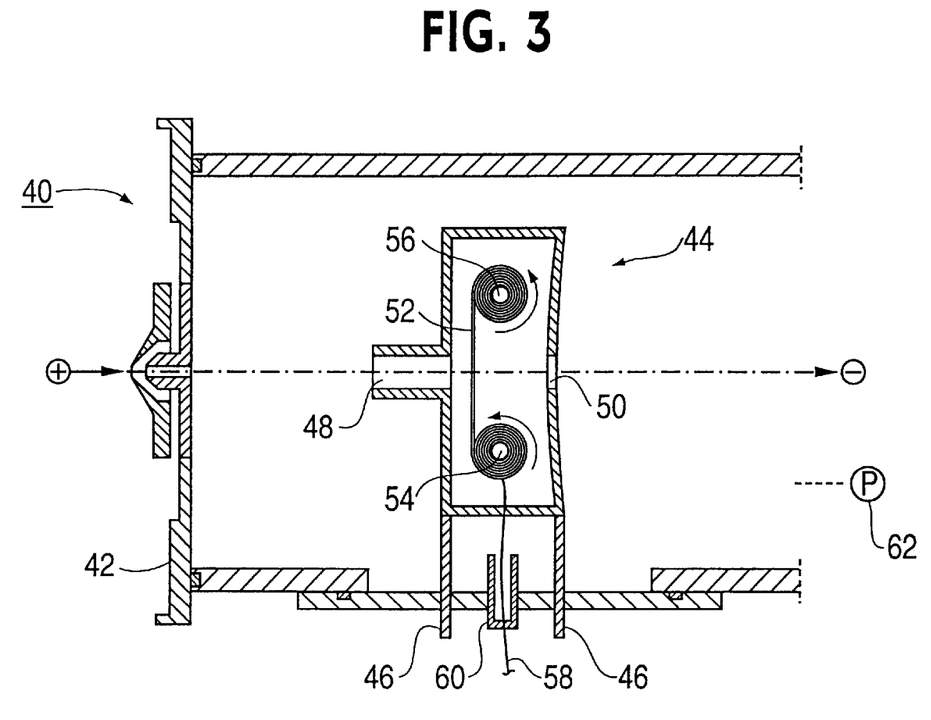
FIG. 3 is a cross-sectional view of an charge exchanger according to the present invention.

Preferred embodiments of the present invention will now be described in detail with reference to the accompanying drawings. The overall structure of the charge exchanger 40 according to the present invention is shown in FIG. 3. Such an charge exchanger 40 can be employed in the type of ion implantation system shown in FIG. 1, such as a Deep Process ion implantation system in which ions are injected deeper than 0.2 $\mu$m from the surface of a wafer, as well as in similar types of systems.

Referring now to FIG. 3, an ion beam exchanger housing 44 is held in place by two fixing members 46 inside a casing 42 of the charge exchanger 40. The housing 44 has a beam inlet 48, a beam outlet 50, and a vertically extending coated tape 52 interposed therebetween. The coated tape 52 comprises a base of a synthetic resin having minute magnesium particles deposited thereon. The tape 52 is wound around a main rotation shaft 54 and a sub-rotation shaft 56 of the ion beam exchanger housing 44. The shafts 54 and 56 can be interlocked for co-rotation by any appropriate means. The casing 42 includes a cable inlet 60 through which a cable 58 passes. The cable inlet 60 is provided between the fixing members 46. The cable 58 is connected to a motor connected to the main rotation shaft 54. In addition, a vacuum pump 62 forms a vacuum inside the charge exchanger 40.

In the present invention as described above, an ion beam from an extractor 2 is introduced into the charge exchanger 40, where it travels through the inlet 48 of the ion beam exchanger housing 44. The ion beam is converted from a positive ion beam to a negative ion beam while passing through the coated tape 52. The negative ion beam is supplied to a mass analyzer 5 via the outlet 50 of the ion beam exchanger housing 44.

Figure 4:
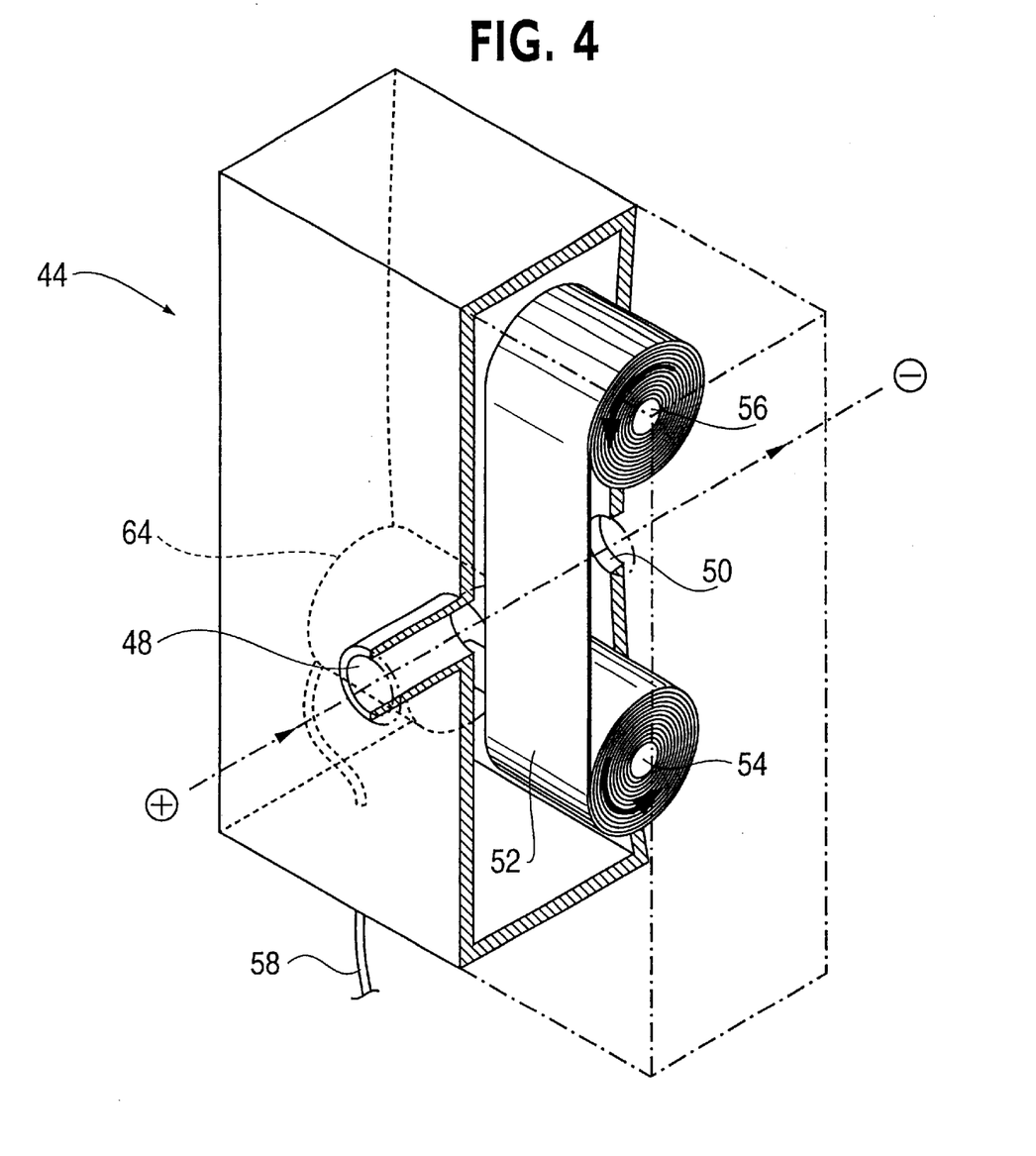
FIG. 4 is a detailed perspective view of the charge exchanger.

The ion beam exchanger housing 44 is illustrated in more detail in FIG. 4. The inlet 48 is a cylinder made of a metallic material such as molybdenum (Mo) or tungsten (W). The cylinder protrudes from a front wall of the ion beam exchanger housing 44. A variable speed motor 64 is connected to the main rotation shaft 54 to apply a driving force to the coated tape 52, whereby the coated tape 52 is wound in one direction at a certain speed.

The coated tape 52 is wider than the diameter of the inlet 48 through which the ion beam is induced. The tape 52 thus provides a sufficient area over which the ions of the ion beam can become bonded to the magnesium molecules. The base of the coated tape 52 is coated with a dense thin film of fine magnesium powder to ensure a high probability of collision between ions of the ion beam and the molecules of magnesium.

During this process, the coated tape 52 is wound on the main rotation shaft 54 and is simultaneously unwound from the sub-rotation shaft 56 by the motor 64. The speed at which the motor 64 is operated is selected considering the desired depth of ion implantation, energy of the ion beam, and dosage, etc.

Figure 5:
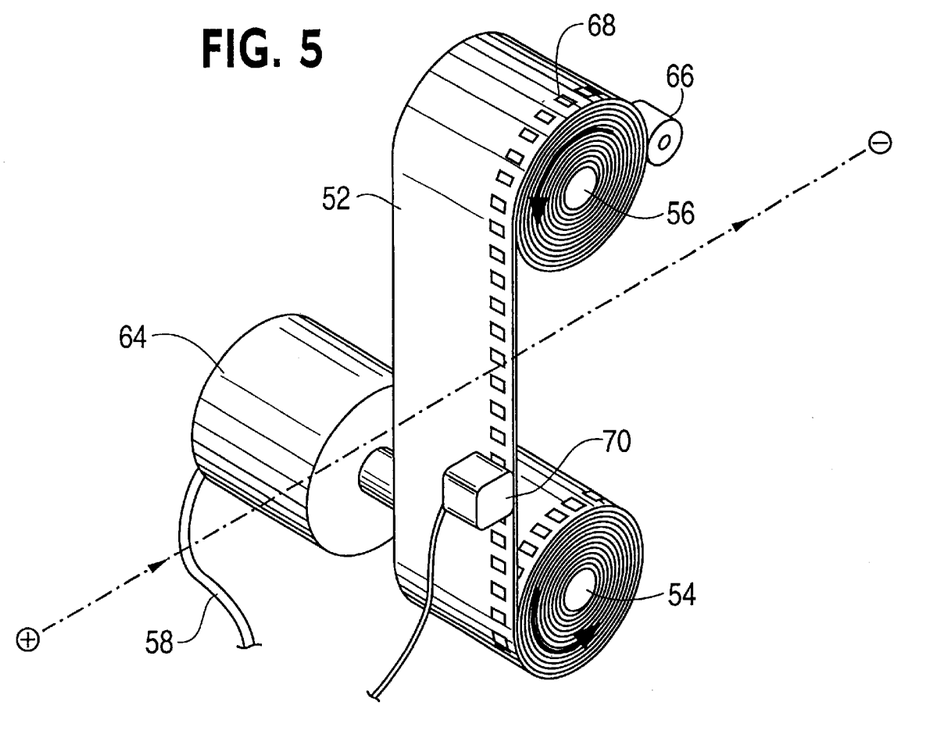
FIG. 5 is a perspective view of interior components of the charge exchanger, showing one form of indicia-bearing charge exchange tape and an associated sensor according to the present invention.

Referring to FIG. 5, a tensioner 66 in the form of a tensioned roller serves to tension the coated tape 52 as it is unwound from the sub-rotation shaft 56. The coated tape 52 has a track of indicia by which the speed at which the tape is wound around the rotation shaft 54 by the motor 64 can be determined. The indicia can be made up of marks 68 of a certain size and spaced apart at fixed intervals. The marks 68 are formed at the edge of the coated tape 52. A sensor head 70 is provided to sense the marks 68. The marks 68 can be magnetic in which case the sensor head can sense the presence of the magnetic fields emanating from the marks.

When the motor 64 is turned on, the sensor head 70 is moved opposite the track to sense the marks 68 spaced apart from one another at uniform intervals. If the motor 64 stops, the sensor head 70 is moved away from the coated tape 52.

Figure 6:
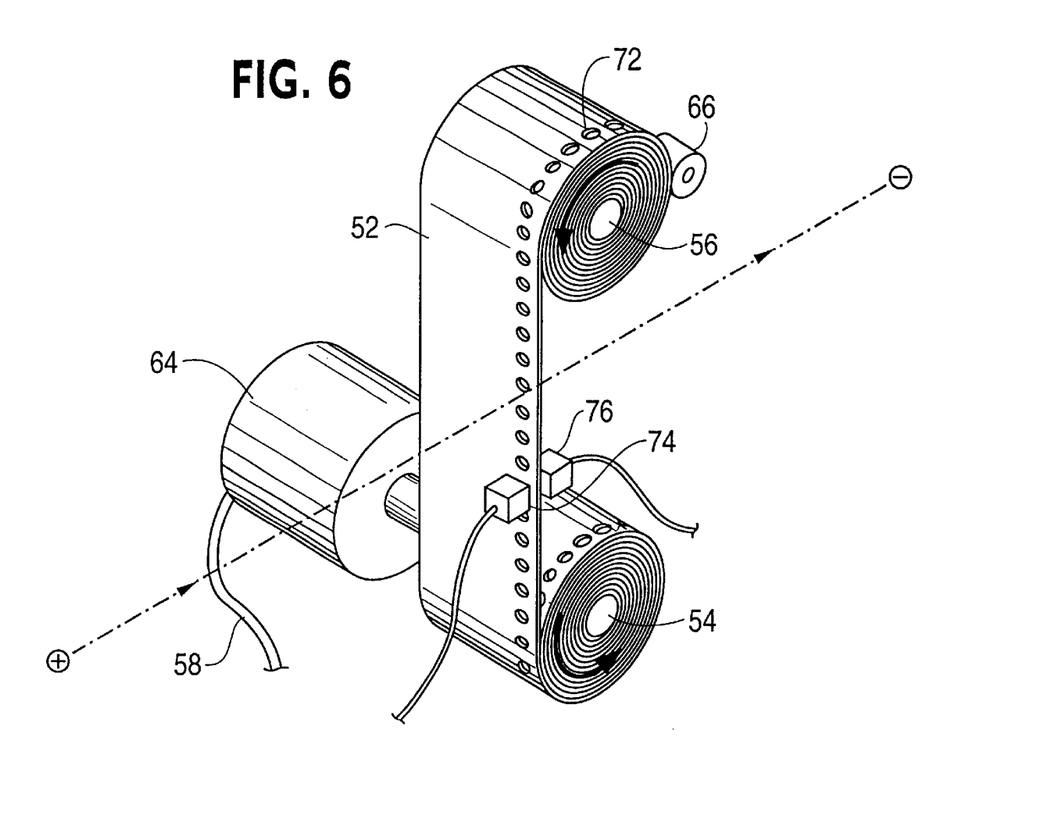
FIG. 6 is a perspective view of interior components of the charge exchanger, showing another form of indicia-bearing charge exchange tape and an associated sensor according to the present invention.

FIG. 6 shows another embodiment of the charge exchanger. In this case, the coated tape 52 has a series of holes 72 formed at constant intervals alongside an edge thereof. A light-emitting member 74 faces the holes 72 at one side of the tape 52, whereas a light-receiving member 76 faces the holes at the other side of the tape 52. Therefore, the speed of the coated tape 52 can be determined from the rate at which light signals are received by the light-receiving member 76.

Figure 7:
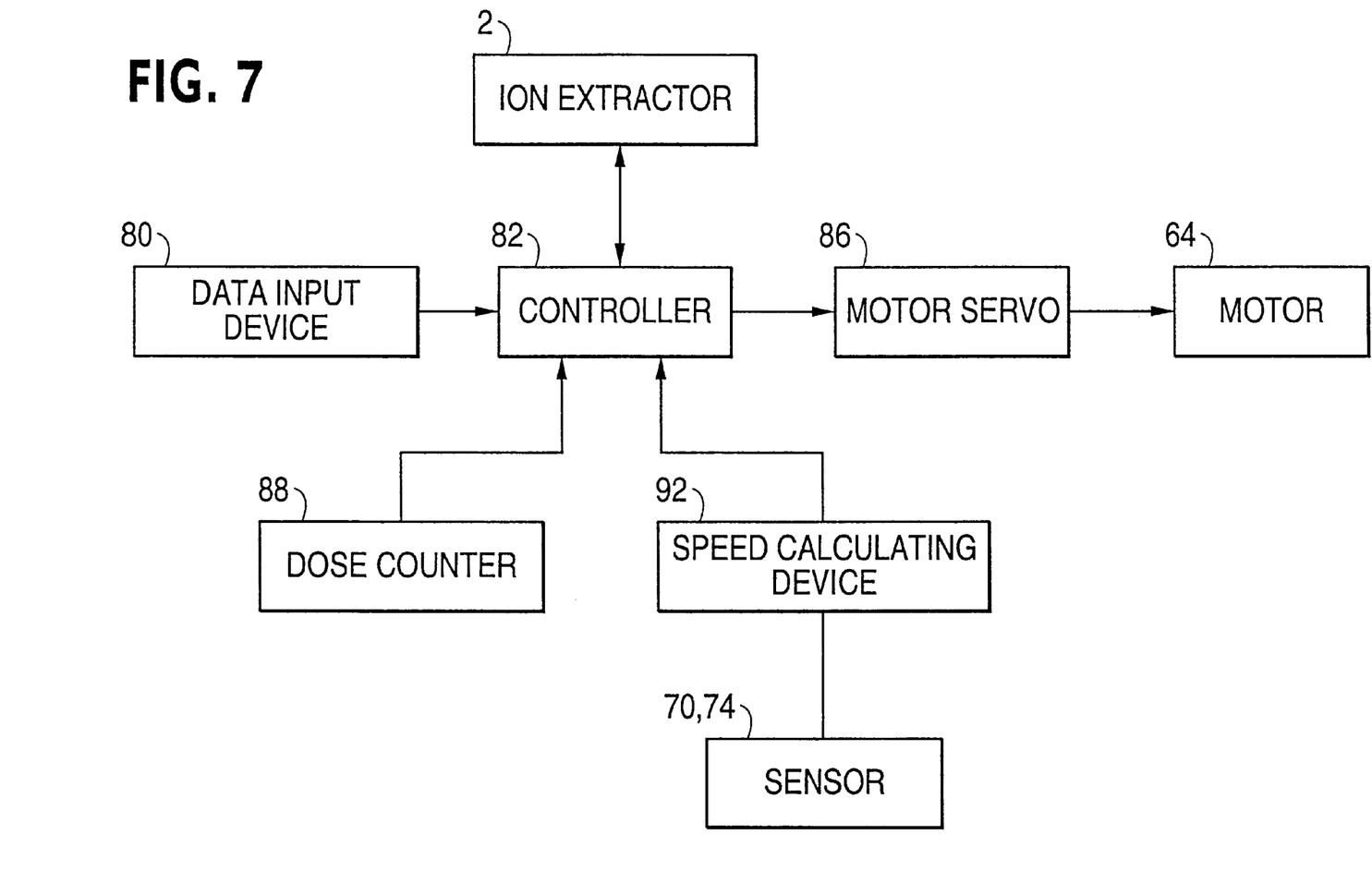
FIG. 7 is a block diagram of control equipment of an ion implantation system according to the present invention.
Figure 8:
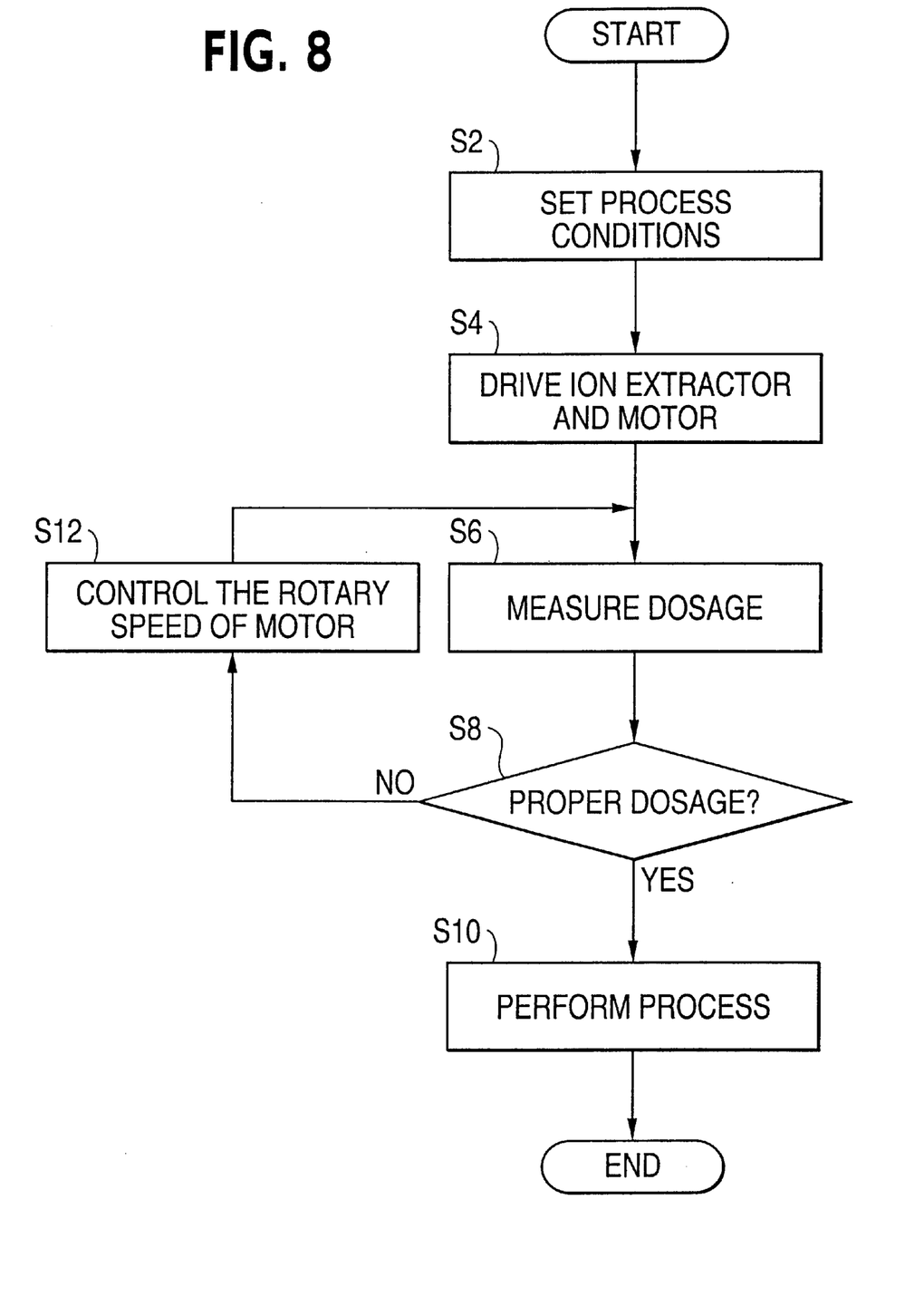
FIG. 8 is a flow chart of a first embodiment of a method of controlling an charge exchange rate during ion implantation according to the present invention.
Figure 9:
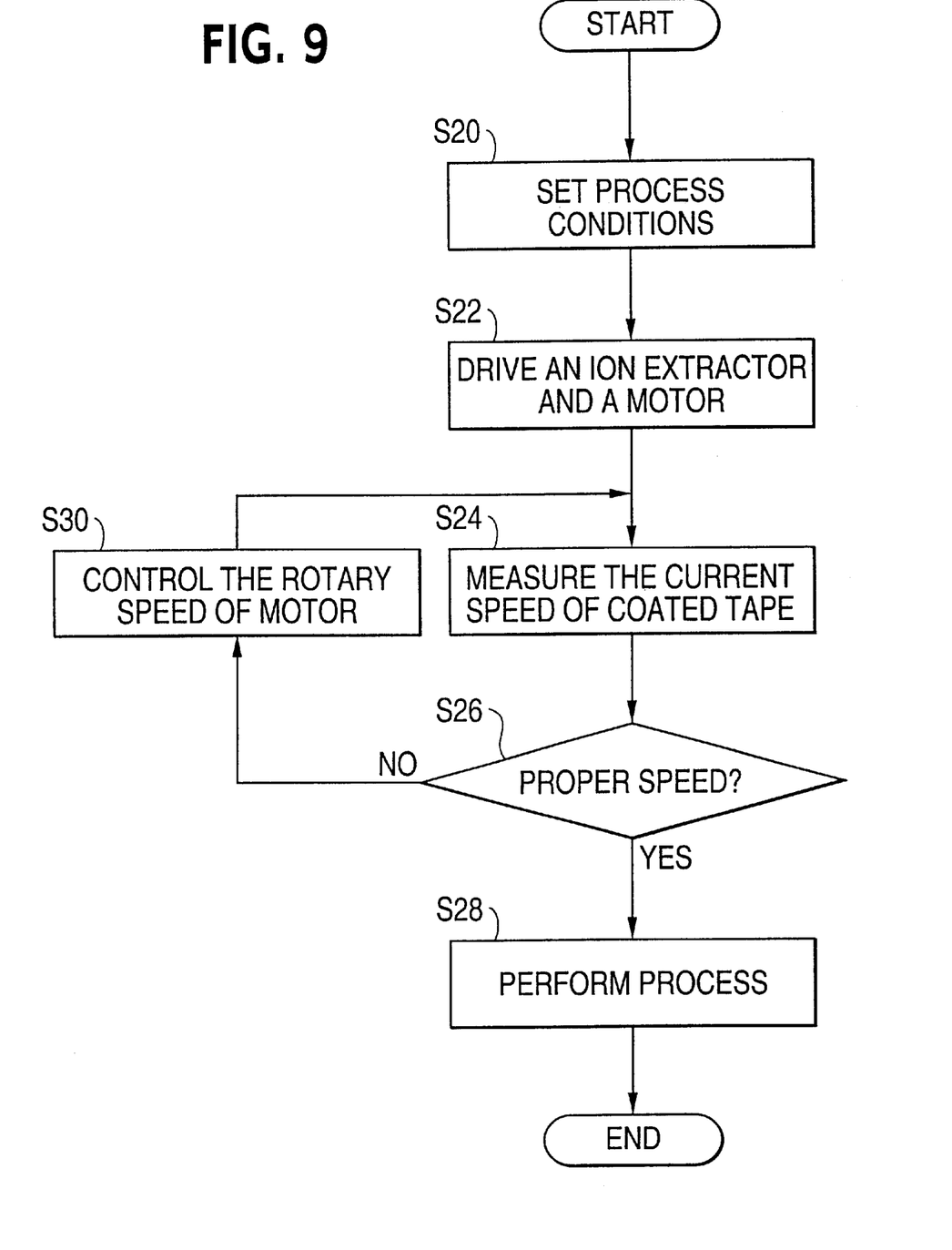
FIG. 9 is a flow chart of a second embodiment of a method of controlling an charge exchange rate during ion implantation according to the present invention.

FIGS. 7–9 show how the motor 64 is controlled to thereby control the charge exchange rate. In FIG. 7, a data input device 80, into which the data for ion-implantation is keyed, is connected to a controller 82. The data input device 80 has a program that establishes the operating conditions of the ion implantation system based on the data input thereto. The ion extractor 2, and a servo 86 of the motor 64 are connected to the controller 82. Furthermore, a dose counter 88, installed in the final processing station 8 to measure the dosage of ions directed thereto, is also connected to the controller 82. Finally, a speed calculating device 92 is connected to the controller 82 and to the sensor 70 or 74. The speed calculating device generates a signal corresponding to the speed of the coated tape 52 based on signals issued by the sensor 70 or 74.

To control the charge exchange rate, the speed of the motor 64 can be controlled based on measurements of the dosage or the speed of the coated tape 52.

First, a method of controlling the speed of the motor 64 based on the dosage can be performed as follows. Referring to FIG. 8, the parameters under which ion implantation is to be carried out are set (S2) by the data input device 80, and the ion extractor 2 and the motor 64 are driven (S4) at rates calculated to effect ion implantation within the established parameters. Subsequently, the dose counter 88 measures the dosage (S6) of ions reaching the target, and if the measured value (S8) is within an allowable range of the value calculated in step (S2), the process is continuously performed without any changes (S10). However, if the measured value of the dosage is outside the allowable range of values, the controller 82 issues a control signal to the motor servo 86 which causes the motor 64 to rotate (S12) at a different speed calculated by a program stored in the controller 82 to produce ion implantation within the parameters established by the data input device 80.

That is, if the measured dosage is less than a value necessary to effect a desired implantation of ions in the target, the charge exchange rate is determined to be too low. That is, the coated tape 52 is determined to be moving too slowly to cause a high enough probability of collision between ions of the ion beam and magnesium molecules on the tape 52. In this case, the controller 82 supplies control signals to the motor servo 86 which in turn increases the rotational speed of the motor 64. As a result, the speed of the coated tape 52 is increased, and more magnesium molecules collide with the ion beam thereby increasing the charge exchange rate.

Of course, if the dosage of ions being implanted is too high, the controller 82 can gradually decrease the speed of the motor 64 until the ions are being implanted with a desired dosage.

Next, a method of controlling the charge exchange rate based on the rotational speed of the motor 64 will be described with reference to FIG. 9. The parameters under which ion implantation is to be carried out are set (S20) by the data input device 80, and the ion extractor 2 and the motor 64 are driven (S22) to implant ions. The depth to which the ions will be injected into a wafer depends on the energy of the ion beam. In this method, the specific energies needed to inject the ions to certain depths are stored as statistical data in the data input device 80. This data is used to calculate the speed at which the coated tape 52 should travel to be in accord with the energy supplied to the ion beam.

Indicia on the coated tape 52 in the form of the marks 68 or holes 72 is sensed by the sensor 70 or 74. The speed of the coated tape 52 is measured (S24) by the number of the marks 68 or holes 72 sensed per unit of time, e.g., per hour. Then, the speed of the coated tape 52, as measured by the speed calculating device 92, is monitored by the controller 82 (S26).

As long as the speed of the coated tape 52 is proper, the controller 82 allows the process to continue uninterrupted (S28). However, if the measured speed is too high or too low, a driving signal is issued by the controller 82 to the motor servo 86 to establish a motor speed (S30) which causes the coated tape 52 to travel at the predetermined speed.

According to the embodiments of the present invention as described above, the extracted ions collide with a high density of magnesium molecules. In addition, the power consumption of the ion convertor is relatively low. Therefore, the charge exchange rate is high, the efficiency of the facility in which the charge exchanger is employed is correspondingly high, and the process is economical to carry out. Moreover, the molecules are situated on a medium, i.e., a plastic tape, whereby they will not contaminate the inside of the charge exchanger.

Although the present invention has been described in detail above, various changes, substitutions and alterations thereto will become apparent to those of ordinary skill in the art. For instance, although the charge exchanger has been described in connection with ion implantation equipment, the charge exchanger can be employed by any equipment in which it is necessary to change the polarity of an ion beam. Therefore, all such changes, substitutions and alterations are seen to be within the true spirit and scope of the present invention as defined by the appended claims.

What is claimed is:

1. A charge exchanger comprising a housing defining an inlet and an outlet through which an ion beam can travel along a given path defined therebetween; and a coated charge exchange member interposed in the path between said inlet and said outlet so as to intercept an ion beam traveling therealong, said coated charge exchange member comprising a base film and charge conversion material on said base film, whereby an ion beam impinging the coated charge exchange member will have its polarity affected by the charged particles.

2. The charge exchanger of claim 1, wherein said base film is of a synthetic resin.

3. The charge exchanger of claim 2, wherein said coated charge exchange member is in the form of tape.

4. The charge exchanger of claim 1, wherein said charge exchange member is coated with particles of magnesiun.

5. The charge exchanger of claim 1, wherein said inlet is a metallic tubular member.

6. The charge exchanger of claim 1, and further comprising drive means for advancing said charge exchange member in a direction non-parallel to said path in order to place other portions of said charge exchange member in said path for exposure thereof to an ion beam.

7. The charge exchanger of claim 6, wherein said drive means is a motor operatively coupled to said charge exchange member.

8. The charge exchanger of claim 7, wherein said coated charge exchange member is in the form of tape, and further comprising a pair of rotary shafts around which both ends of the tape are wound, respectively, said motor being connected to one of said shafts.

9. The charge exchanger of claim 8, and further comprising a tensioner operatively associated with the other of said rotary shafts so as to tension the portion of the tape wound therearound.

10. The charge exchanger of claim 7, wherein said motor is a stepper motor.

11. The charge exchanger of claim 6, wherein said charge exchange member has machine readable indicia extending therealong, and further comprising a sensor capable of sensing the indicia as said charge exchange member is advanced by said drive means, and a calculator operatively connected to said sensor so as to calculate the speed of said member based on the sensing of said indicia by said sensor.

12. The charge exchanger of claim 11, wherein said indicia is a magnetic imprint.

13. The charge exchanger of claim 11, wherein said indicia is a series of holes in said base film, the holes being spaced apart from one another at uniform intervals, and said sensor comprises a light emitting member and a light receiving member disposed across from one another at locations confronting said series of holes on opposite sides of said charge exchange member, respectively.

14. A method of controlling the dosage at which a target is injected with ions of an ion beam, said method comprising steps of:
preselecting a desired dosage of ion beam for the target;
producing an ion beam having a given polarity;
accelerating the ion beam toward the target;
placing, in a path of the ion beam, a coated charge exchange member comprising a base film having thereon charge conversion material, whereby the ion beam impinging the coated charge exchange member will have its polarity affected by the charge conversion material at a charge exchange rate; and
advancing the charge exchange member, in a direction non-parallel to said path, in order to place other portions of said charge exchange member in said path for exposure thereof to the ion beam, and at a speed which sets the charge exchange rate to one which produces an ion beam that will have said desired dosage when it is injected into the wafer.

15. The method of claim 14, wherein said step of advancing comprises measuring the dosage of the ion beam injected into the target, and adjusting the speed by which the charge exchange member is advanced based on the measured dosage.

16. The method of claim 15, wherein the speed is adjusted by measuring a current speed at which the charge exchange member is being advanced, calculating a new speed necessary to establish the charge exchange rate which produces an ion beam that will have said desired dosage, and advancing the charge exchange member at said new speed.

17. The method of claim 14, wherein said step of advancing comprises predetermining parameters of ion implantation, storing specific energies needed to inject the ions of the ion beam to certain depths as statistical data, calculating from said data a theoretical speed at which the charge exchange member is to be advanced, measuring a current speed at which the charge exchange member is being advanced, and adjusting the current speed until it matches the theoretical speed.

18. The method of claim 16, wherein said step of placing an charge exchange member in said path comprises placing, in said path, an charge exchange member having indicia disposed therealong, and the current speed at which the charge exchange member is being advanced is measured by determining the rate at which the indicia passes a given location.

19. The method of claim 17, wherein said step of placing an charge exchange member in said path comprises placing, in said path, an charge exchange member having indicia disposed therealong, and the current speed at which the charge exchange member is being advanced is measured by determining the rate at which the indicia passes a given location.

20. An ion implantation system comprising:
an extractor which forms an ion beam from a source of ions;
a mass analyzer which mass-analyzes the ion beam;
an accelerator which supplies the ion beam with energy to accelerate the ion beam;
an ion implantation station having a holder which holds a wafer to be injected; and
an charge exchanger which changes the polarity of the ion beam formed by said extractor, said charge exchanger comprising a casing having an inlet and an outlet spaced apart along a path of the ion beam, an charge exchange member disposed between said inlet and said outlet in the path of the ion beam, the charge exchange member having a base film through which the ion beam can pass, and a charge conversion material coating the base film which changes the polarity of the ion beam when a sufficient number of ions of the ion beam collide therewith, and drive means for advancing said charge exchange member in a direction non-parallel to said path in order to place other portions of said charge exchange member in said path for exposure thereof to the ion beam.

21. The ion implantation system of claim 20, wherein said charge conversion material is magnesium, and said base film is plastic tape.

22. The ion implantation system of claim 20, wherein said drive means is a motor operatively connected to said charge exchange member.

23. The ion implantation system of claim 22, wherein said charge exchange member is in the form of tape, and said charge exchanger further comprises a pair of rotary shafts around which both ends of the tape are wound, respectively, said motor being connected to one of said shafts.

24. The ion implantation system of claim 23, wherein said charge exchange member has machine readable indicia extending therealong, and further comprising a sensor capable of sensing the indicia as said charge exchange member is advanced by said drive means, and a calculator operatively connected to said sensor so as to calculate the speed of said member based on the sensing of said indicia by said sensor.

25. The ion implantation system of claim 24, wherein said ion implantation station includes a dose counter for measuring the dosage of the ion beam injected into the wafer, and further comprising a drive means servo which controls said drive means, and a controller operatively connected to said calculator and to said dose counter so as to receive signals generated thereby indicative of the speed at which the charge exchange member is being advanced by said drive means and indicative of the dosage of the ion beam injected into the wafer, respectively, and said controller being operatively connected to said drive means servo so as to output control signals to said drive means servo based on the signals input to the controller from said calculator and said dose counter.

26. The ion implantation system of claim 25, and further comprising a data input device by which desired ion implantation process conditions including a desired dosage can be input to said controller, said controller determining any difference between the desired dosage and the dosage measured by said dose counter to generate said output control signals.

27. The ion implantation system of claim 20, wherein said charge exchange member has machine readable indicia extending therealong, and further comprising a sensor capable of sensing the indicia as said charge exchange member is advanced by said drive means, and a calculator operatively connected to said sensor so as to calculate the speed of said member based on the sensing of said indicia by said sensor.

28. The ion implantation system of claim 27, wherein said indicia is a magnetic imprint.

29. The ion implantation system of claim 27, wherein said indicia is a series of holes in said base film, the holes being spaced apart from one another at uniform intervals, and said sensor comprises a light emitting member and a light receiving member disposed across from one another at locations confronting said series of holes on opposite sides of said charge exchange member, respectively.

* * * * *